(12) United States Patent
Schenk

(10) Patent No.: US 7,112,899 B2
(45) Date of Patent: Sep. 26, 2006

(54) DEVICE FOR CONTROLLING AN ELECTRIC LOAD, AND A CONTROL DEVICE

(75) Inventor: Joachim Schenk, Meinersen-Ohof (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/494,498

(22) PCT Filed: Oct. 22, 2002

(86) PCT No.: PCT/DE02/03976

§ 371 (c)(1),
(2), (4) Date: Oct. 6, 2004

(87) PCT Pub. No.: WO03/041237

PCT Pub. Date: May 15, 2003

(65) Prior Publication Data

US 2005/0017730 A1    Jan. 27, 2005

(30) Foreign Application Priority Data

Nov. 3, 2001  (DE) ............................. 101 54 158

(51) Int. Cl.
*H01H 19/00* (2006.01)

(52) U.S. Cl. .................................. 307/113; 307/115

(58) Field of Classification Search ............... 307/115, 307/113
See application file for complete search history.

(56) References Cited

U.S. PATENT DOCUMENTS

| 5,642,696 | A | * | 7/1997 | Matsui ................. 123/179.1 |
| 5,648,739 | A | * | 7/1997 | Walther et al. ............. 327/330 |
| 6,140,821 | A | | 10/2000 | Fendt et al. ................ 324/502 |
| 6,535,126 | B1 | * | 3/2003 | Lin et al. .................... 340/550 |
| 6,548,980 | B1 | * | 4/2003 | Sakuma et al. ............. 318/482 |
| 6,577,024 | B1 | * | 6/2003 | Kikuta et al. .............. 307/10.1 |
| 6,600,238 | B1 | * | 7/2003 | Emberty et al. .............. 307/85 |
| 2002/0117982 | A1 | * | 8/2002 | Jehn ........................... 318/280 |

FOREIGN PATENT DOCUMENTS

DE    196 11 522    9/1997

* cited by examiner

*Primary Examiner*—Brian Sircus
*Assistant Examiner*—Daniel Cavallari
(74) *Attorney, Agent, or Firm*—Kenyon & Kenyon LLP

(57) ABSTRACT

A device for controlling at least one electrical load and a control device therefor. The electrical load includes a first load connection and a second load connection. The first load connection is able to be connected to an operating-voltage potential via a first controlled switch, and the second load connection is able to be connected to a reference voltage potential via a second controlled switch.

16 Claims, 4 Drawing Sheets

DEVICE FOR CONTROLLING AN ELECTRIC LOAD, AND A CONTROL DEVICE

FIELD OF THE INVENTION

The present invention relates to a device for controlling at least one electrical load and to a control device therefor.

BACKGROUND INFORMATION

Relays in motor vehicles may be controlled by just a single control device. It is the terminals of a coil of the electromagnetic actuator that are controlled.

SUMMARY OF THE INVENTION

With the exemplary device according to the present invention for controlling at least one electrical load and the control device according to the present invention, exactly only one load terminal is able to be controlled by a controlled switch and may be connected, via the controlled switch, to precisely one potential, in particular an operating-voltage potential or a reference voltage potential. In this way, two controlled switches are required to operate the electrical load in order to connect one of the two load terminals to the operating-voltage potential and the other of the two load terminals to the reference voltage potential, thereby allowing a current flow in the load. If one of the two controlled switches is faulty to the extent that it is always conducting, the electromagnetic actuator may be controlled via the other controlled switch. In this way, the switching function of the electromagnetic actuator may be ensured in a more optimal and more reliable manner. Moreover, using two controlled switches allows a more differentiated control of the load, for example as a function of a plurality of conditions.

A detection circuit, which detects the potential at this load terminal, is connected to at least one of the two load terminals. In this way, the switching state of the controlled switch triggering the other load terminal may be ascertained at this load terminal.

An operating mode is provided in which a signaling of one of the two controlled switches takes place to the load terminal of the other controlled switch in the form of at least one switching state, via the load, and a detection of the voltage resulting therefrom by the detection circuit at the load terminal of the other controlled switch. The functionality of the load may be increased in this manner so that it not only leads to the initiation of a load state of the electrical load, but also allows a communication between the control devices controlling the load terminals. Thus, separate connecting lines between the control devices for establishing a communication connection may be dispensed with.

A high-ohmic resistor may be connected in parallel to one of the two switches, thereby connecting the load terminals to a defined potential.

This may also be achieved, at least intermittently, in that a high-ohmic resistor may be connected in parallel to one of the two controlled switches, for example by an associated additional controlled switch, or by switching a switch into a high-ohmic but still conducting state.

In an actuator-operating mode of the device, at least one of the high-ohmic resistors is connected in parallel to one of the switches controlling the load, so that the switching state of the other controlled switch controlling the load is detectable at the load terminal assigned to this load. Due to the at least one resistor connected in parallel, a defined potential at the load terminals and thus a reliable detection of the load state may be obtained.

By ascertaining the switching state of the one controlled switch, at the control device of the other controlled switch, it may be detected whether a current flow in the load may be effected by the other controlled switch and thus, if the load is designed as a coil of an electromagnetic actuator, a responding electromagnetic actuator. The other controlled switch may then be triggered as a function of this information. In this way, a differentiated and intelligent control of the load is able to be realized in a simple manner.

In a communication operating mode of the device, a communication between the two load terminals takes place via the load, by energizing or de-energizing the particular high-ohmic resistor at the one load terminal and detecting the voltage resulting therefrom at the respective other load terminal. In this way, the communication may be realized via the load, independent of the controlled switches controlling the load and thus independent of an activation of an electromagnetic actuator, if the load is embodied as coil of such an actuator.

DETAILED DESCRIPTION

Figure 1:
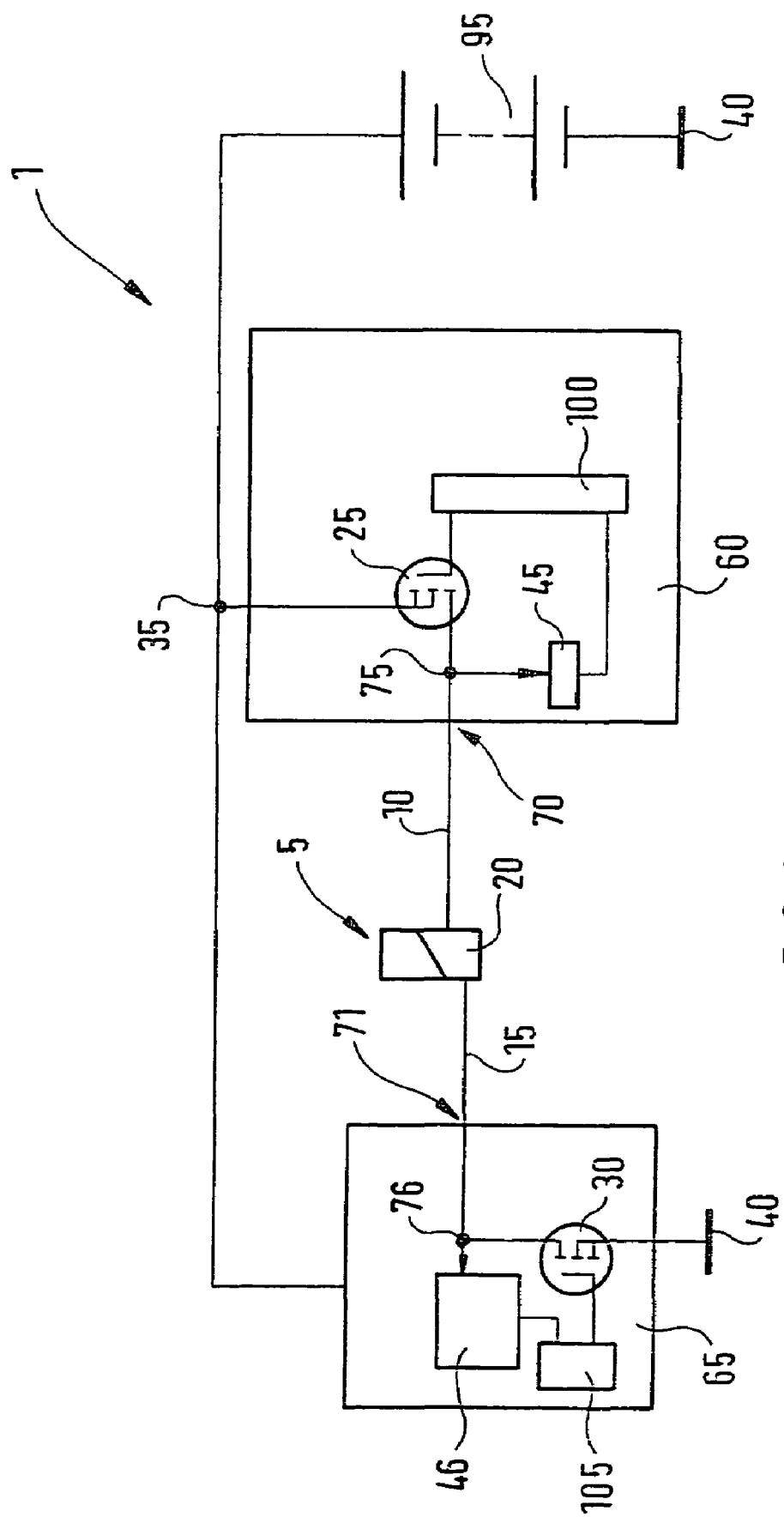
FIG. 1 shows a first exemplary embodiment of a device according to the present invention for triggering an electromagnetic actuator.

In FIG. 1, the device 1 denotes a device for triggering an electromagnetic actuator 5, which in this exemplary embodiment is arranged as a relay by way of example, and of which only a coil 20 is shown as an example of an electrical load. A voltage source 95, for instance a battery of a motor vehicle, lies between a reference-voltage potential 40, referred to as ground in the following, and an operating electric potential 35. Voltage source 95 is provided as voltage supply for a first control device 60 and a second control device 65. Coil 20 includes a first coil connection 10 and a second coil connection 15. First coil connection 10 is connected to a first connecting contact 75 of first control device 60, first connecting contact 75 constituting the single connecting contact of a first control terminal 70 of first control device 60 for the triggering of relay 5. Second coil connection 15 is connected to a second connecting contact 76 of second control device 65, second connecting contact 76 forming the single connecting contact of a second control terminal 71 of second control device 65 for the triggering of relay 5.

On one side, first connecting contact 75 is connected to a first detection circuit 45 of first control device 60. On the other side, first connecting contact 75 may be connected to operating-voltage potential 35 via a first controlled switch 25 of first control device 60. Second connecting contact 76 is connected to a second detection circuit 46 of second control device 65 on one side, and second connecting contact 76 is able to be connected to ground via a second controlled switch 30 of second control device 65 on the other side. Furthermore, first control device 60 includes a first control 100 to which first detection circuit 45 is connected and which triggers first controlled switch 25.

Second control device 65 includes a second control 105 to which second detection circuit 46 is connected and which triggers second controlled switch 30. According to FIG. 1, both controlled switches 25, 30 are embodied as field-effect transistors by way of example. However, one of the two controlled switches 25, 30 or both controlled switches 25, 30 may also have any other design known to one skilled in the art, and be embodied as bipolar transistors, for example.

In an actuator-operating mode or a relay-operating mode, the two controlled switches 25, 30 are used to trigger coil 20 of relay 5. As soon as both controlled switches 25, 30 are closed, i.e., are brought into the conductive state, a current begins to flow through coil 20 of relay 5, and relay 5 is switched. As soon as one of the two controlled switches 25, 30 is opened, i.e., brought into the disabled state, the current flow through coil 20 of relay 5 is interrupted and relay 5 is switched back.

In this way, the switching of relay 5 may be tied to two conditions. When these are satisfied, first control 100 brings first control 100 into the conductive state and second control 105 brings second controlled switch 30 into the conductive state as well. If only one of the two conditions is not satisfied, one of the two controlled switches 25, 30 is triggered such that it blocks, so that relay 5 is unable to be switched and is present in the switched-back state. If a load is switched into a load-current circuit by the switching of relay 5, this may be made dependent on the simultaneous satisfaction of the two conditions.

Furthermore, a safety function may be realized by the use of the two controlled switches 25, 30. If one of the two controlled switches 25, 30 is defective in that it continuously remains in a conductive state regardless of its triggering, relay 5 may then be switched and switched back solely by the other, non-defective controlled switch.

If there is a change in the switching state of first controlled switch 25, a change in the potential at second connecting contact 76 will occur, which is detected by second detection circuit 46. Second detection circuit 46 is thus able to detect a change in the switching state of first controlled switch 25. For example, if first controlled switch 25 and second controlled switch 30 are initially open and first controlled switch 25 is then closed, the potential at second connecting contact 76 is adjusted from an initially undefined value to approximately operating-voltage potential 35. If the initially undefined potential is not equal to operating-voltage potential 35, a potential change to approximately operating-voltage potential 35 takes place at second connecting contact 76 when first controlled switch 25 is closed, which is detected by second detection circuit 46. Second detection circuit 46 thus detects a change in the switching state of first controlled switch 25.

If, conversely, given the same original position, i.e., an open first controlled switch 25 and open second controlled switch 30, second controlled switch 30 is closed, the potential at first connecting contact 75 changes from an undefined potential to approximately ground 40, provided the undefined potential was not equal to ground 40. In this way, this potential change and a switching procedure of second controlled switch 30 are able to be detected in first detection circuit 45.

The described detection of switching procedures of first controlled switch 25 and second controlled switch 30 may also be utilized for a communication between both control devices 60, 65. This communication may occur independently of an activation of relay 5 if it is ensured that at least one of the two controlled switches 25, 30 is open at all times for the duration of the communication. For instance, by switching or modifying the switching state of first controlled switch 25, first control device 60 is able to generate a binary signal, which may be detected by second detection circuit 46 in second control device 65 via detection of the individual switching state at second connecting contact 76. While first control device 60 in this way transmits a signal to second control device 65 via coil 20, second controlled switch 30 is open. The switching states of first controlled switch 25 are implemented at second connecting contact 76 in the manner described in that the potential or the voltage level resulting from the individual switching state of first controlled switch 25 is detected at second connecting contact 76.

Conversely, second control device 65 may transmit signals to first control device 60 via coil 20 in a corresponding manner in that the switching state of second controlled switch 30 is modified to generate a binary signal, and in that the voltage level or voltage potentials resulting therefrom are ascertained and evaluated at first connecting contact 75 by first detection circuit 45. This takes place when first controlled switch 25 is open. In this manner, a bi-directional communication may be established between first control device 60 and second control device 65. However, only one of the two control device 60, 65 is able to transmit at any one time, whereas the other of the two control devices 60, 65 may only receive during that time. The binarity of the individual transmitted signal results from the defined potential during closing of the controlled switch of the transmitting control device and, on the other hand, from an undefined potential, which differs from this defined potential, during opening of the controlled switch of the transmitting control device. The undefined potential, which is different from the defined potential, is viewed like a single value, even if different, undefined potentials may occur during opening of the controlled switch of the transmitting control device.

Figure 2:
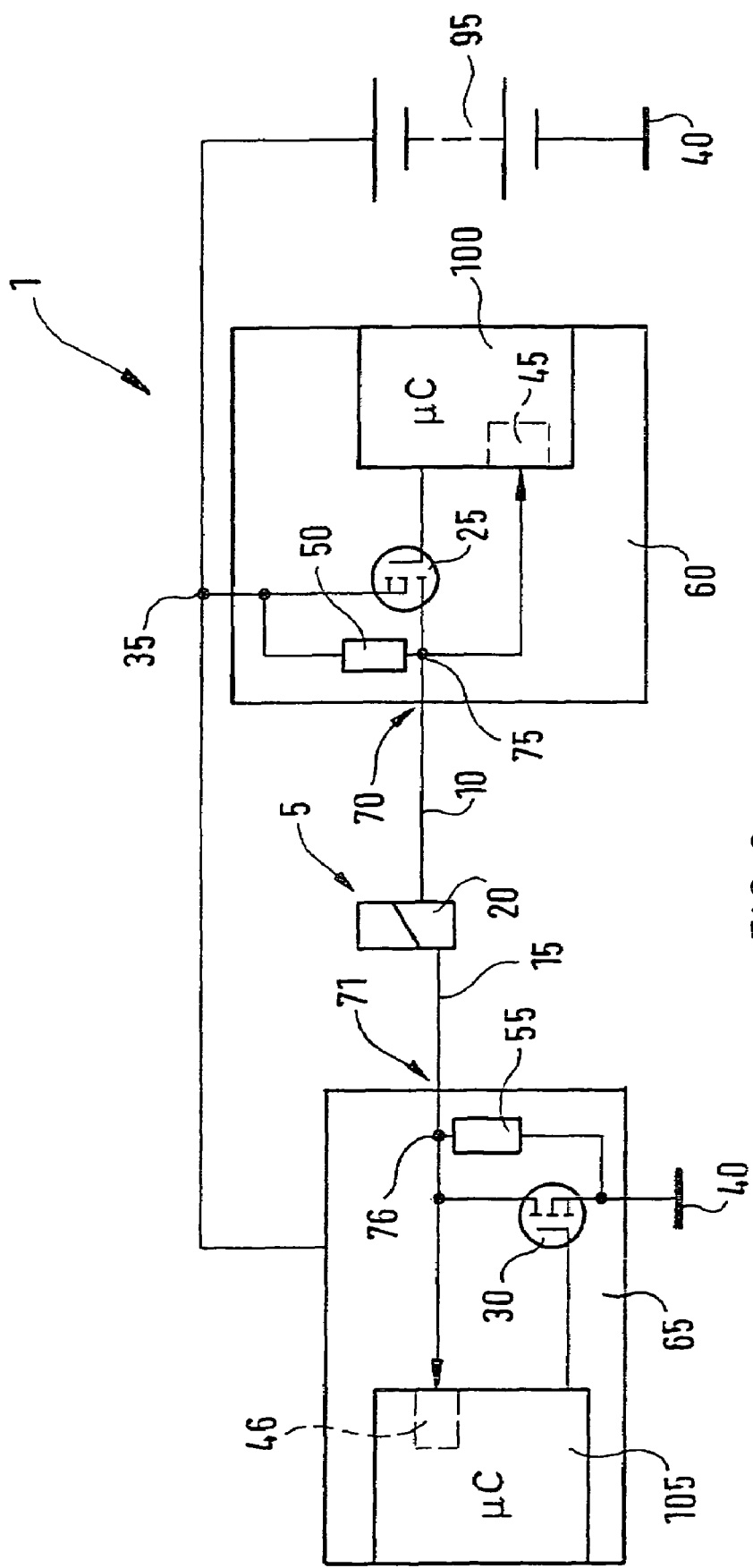
FIG. 2 shows a second exemplary embodiment of a device according to the present invention for triggering an electromagnetic actuator.

FIG. 2 shows a second exemplary embodiment of the device according to the present invention for triggering the relay. Identical reference signs denote elements that are identical to those in FIG. 1. In contrast to FIG. 1, first detection circuit 45 is integrated in first control 100 and second detection circuit 46 is integrated in second control 105. Another difference is that a first high-ohmic resistor 50 is now connected in parallel to the breaker gap of first controlled switch 25 and a second high-ohmic resistor 55 is connected in parallel to the breaker gap of second controlled switch 30. The high-ohmic resistance of first resistor 50 and second resistor 55 are to be selected such that essentially no current flows through coil 20 when first controlled switch 25 is open and when second controlled switch 30 is open, and thus no activation of relay 5 takes place.

Using first resistor 50 and second resistor 55 results in the advantage that a defined potential at first connecting contact 75 and at second connecting contact 76, respectively, may at all times be detected by first detection circuit 45 and second detection circuit 46 even in those cases where both controlled switches 25, 30 are open. When both resistors 50, 55 have approximately the same resistance value, for example, the potential at first connecting contact 75 and at second connecting contact 76 amounts to approximately half of operating-voltage potential 35 when both controlled switches 25, 30 are open. If first controlled switch 25 is open and second controlled switch 30 closed, a potential corresponding approximately to ground 40 results at first connecting contact 75 and at second connecting contact 76. If second controlled switch 30 is open and first controlled switch 25 closed, a potential that corresponds approximately to operating-voltage potential 35 comes about at first connecting contact 75 and at second connecting contact 76.

The functioning method of the exemplary embodiment according to FIG. 2 is thus identical to the functioning method of the exemplary embodiment according to FIG. 1, with the difference that, in the event that both controlled switches 25, 30 are open, a defined potential at first connecting contact 75 and at second connecting contact 76 is ascertained by first detection circuit 45 and by second detection 46 in the second exemplary embodiment according to FIG. 2, so that there is no longer any undefined potential. Given an appropriate selection of the two resistors 50, 55, this potential also differs considerably from operating-voltage potential 35 and ground 40.

A prerequisite is that one of the two resistors 50, 55 is not substantially higher than the other one of the two resistors 50, 55. Otherwise this potential is either considerably closer to mass 40 than to operating-voltage potential 35 or considerably closer to operating-voltage potential 35 than to mass 40, which may easily be inferred from the voltage divider principle.

Setting a defined potential at first connecting contact 75 and at second connecting contact 76 while first controlled switch 25 is open and while second controlled switch 30 is open may be done if only one of the two controlled switches 25, 30 is bridged in its breaker gap by a resistor. Here, too, this resistor should be of such high-ohmic type that a significant current is only allowed to flow through coil 20 if both controlled switches 25, 30 are closed.

If only the breaker gap of one of the two controlled switches 25, 30 is connected in parallel by a resistor, only unidirectional communication may be available, as is illustrated with the aid of the following example. In this example, the breaker gap of first controlled switch 25 is meant to be connected in parallel via first resistor 50, whereas the breaker gap of second controlled switch 30 has no parallel connection. In this case, only a transmission of signals from second control device 65 to first control device 60 may be done. If this communication is to be independent of an activation of relay 5, first controlled switch 25 must remain open. If second controlled switch 30 is then closed, first detection circuit 45 detects a potential at first connecting contact 75 that corresponds approximately to ground 40. If second controlled switch 30 is open, the potential detected by first detection circuit 45 at first connecting contact 75 is approximately equal to operating-voltage potential 35.

Conversely, if second controlled switch 30 remains constantly open and if first controlled switch 25 is alternately open and closed, the potential detected by second detection circuit 46 at second connecting contact 76 remains always approximately equivalent to operating-voltage potential 35, so that no information is able to be transmitted from first control device 60 to second control device 65 via coil 20. In this example, the transmission of data via coil 20 may therefore only be done from second control device 65 to first control device 60. Conversely, if the breaker gap of second controlled switch 30 is connected in parallel by second resistor 55 and the breaker gap of the first controlled switch is not connected in parallel, only a unidirectional communication or data flow via coil 20 from first control device 60 to second control device 65 may be done in a corresponding manner. This follows from analogous considerations of the voltage-divider ratios at first connecting contact 75 and second connecting contact 76 resulting in each case.

Figure 3:
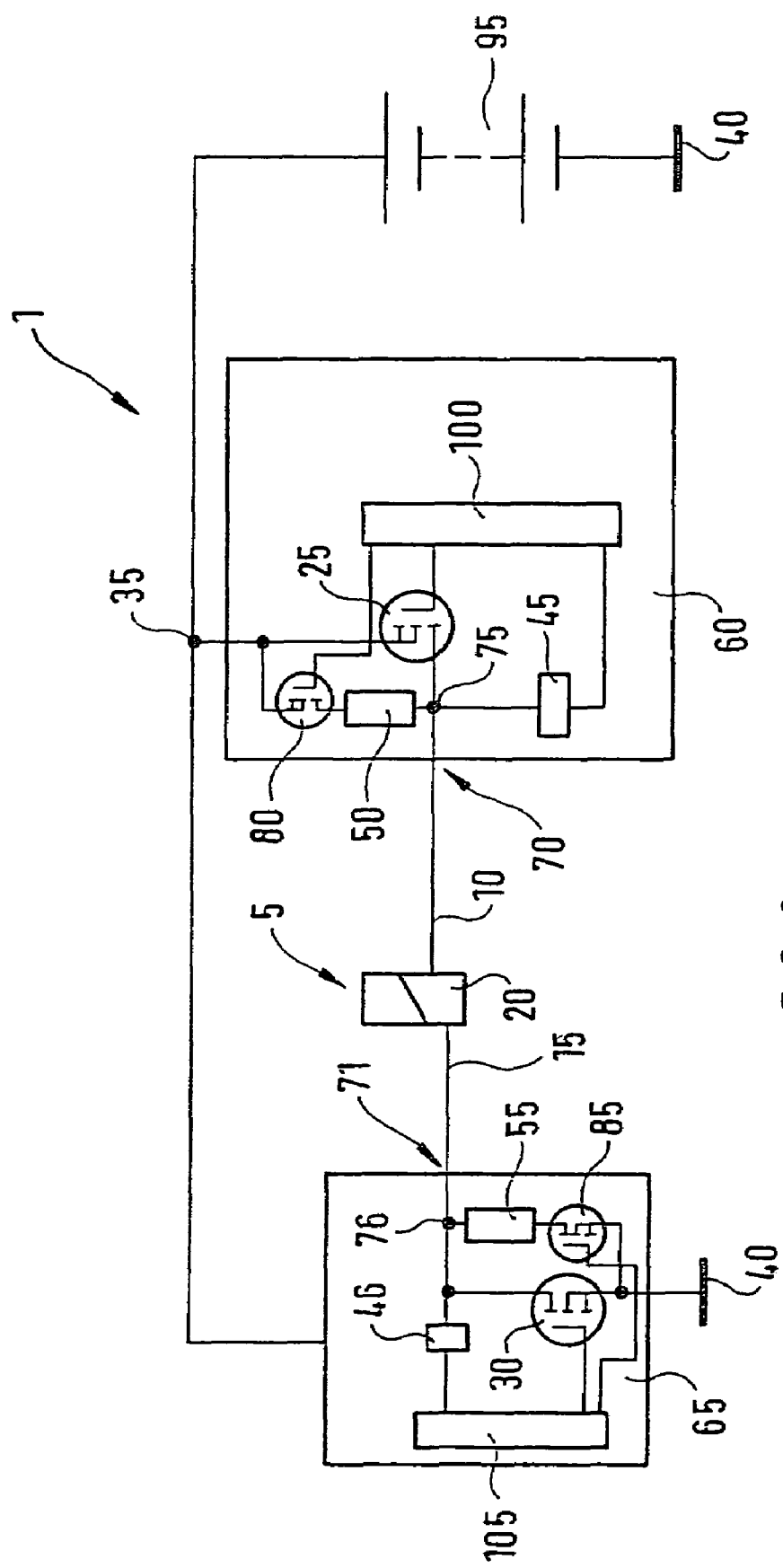
FIG. 3 shows a third exemplary embodiment of a device according to the present invention for triggering an electromagnetic actuator.

FIG. 3 shows a third exemplary embodiment of the device according to the present invention for triggering relay 5. In this context, identical reference numerals again designate matching elements of the previous figures. Like in the exemplary embodiment according to FIG. 1, first detection circuit 45 is arranged outside of first control 100 and second detection circuit 46 is arranged outside of second control 105. Otherwise, according to FIG. 3, a series circuit of first resistor 50 and a third controlled switch 80 is connected in parallel to the breaker gap of first controlled switch 25, third controlled switch 80 also being triggered by first control 100. The breaker gap of second controlled switch 30 is correspondingly connected in parallel by a series circuit of second resistor 55 and a fourth controlled switch 85, fourth controlled switch 85 being triggered by second control 105.

In all other respects, the circuit according to FIG. 3 is configured as shown and described in FIG. 1. Analogously to the second exemplary embodiment, first resistor 50 and second resistor 55 as well as third controlled switch 80 and fourth controlled switch 85, respectively, must be selected such in their ohmic magnitude that no significant current flow is allowed through coil 20 when first controlled switch 25 is open and second controlled switch 30 is open. Third controlled switch 80 and fourth controlled switch 85 may likewise be embodied as field-effect transistors, as shown in the example according to FIG. 3, or they may have any other design known to one skilled in the art, for example, they may also be designed as bipolar transistors. If both third controlled switch 80 and fourth controlled switch 85 are blocked, a situation as illustrated by circuit diagram of the first exemplary embodiment according to FIG. 1 results, which functions in the manner described there.

If either third controlled switch 80 or fourth controlled switch 85 is closed, a defined potential will already result at first connecting contact 75 and second connecting contact 76, regardless of the switching state of first controlled switch 25 and second controlled switch 30, thereby realizing an operating mode described according to FIG. 2 in which either the breaker gap of first controlled switch 25 or the breaker gap of second controlled switch 30 is connected in parallel by a resistor. If both third controlled switch 80 and fourth controlled switch 85 are closed, a situation as illustrated in the specific embodiment in FIG. 2 results, which functions in the manner described there.

However, in addition there is now a communication possibility between first control device 60 and second control device 65 that is completely independent of the triggering of relay 5 by first controlled switch 35 and second controlled switch 30. For example, in de-energized relay operation, when first controlled switch 25 and second controlled switch 30 are both open, for instance, a communication between both control devices 60, 65 may be implemented in the following manner. If first control device 60 wants to send a signal to second control device 65, fourth controlled switch 85 may be closed, for instance. If third controlled switch is then opened, second detection circuit 46 detects a potential corresponding to approximately ground 40 at second connecting contact 76.

If third controlled switch 80 is closed, second detection circuit 46 detects a potential corresponding to approximately half the operating-voltage potential 35 at second connecting contact 76, provided first resistor 50 and second resistor 55 are of approximately the same size. Conversely, when transmitting from second control device 65 to first control device 60, third controlled switch 80 may be closed and a signal transmission be implemented via coil 20 by opening and closing of fourth controlled switch 85, the resulting potential at first connecting contact 75 being determined by first detection circuit 45. Bi-directional communication between first control device 60 and second control device 65 via coil 20 may be done in this manner as well, both control devices 60, 65 being able to transmit simultaneously.

By energizing and de-energizing third controlled switch 80 during transmission mode of first control device 60, a binary signal, which has the two values, ground 40 and approximately one half operating-voltage potential 35, is then generated again. Furthermore, during transmission mode of second control device 65, a binary signal having the values operating-voltage potential 35 and approximately one half operating-voltage potential 35 is generated by switching of fourth controlled switch 85.

Alternatively, the breaker gap of only first controlled switch 25 or only second controlled switch 30 may be connected in parallel by a series circuit of resistor and additional controlled switch. This is shown by way of example by a parallel connection of the breaker gap of second controlled switch 30 via the series circuit of second resistor 55 and fourth controlled switch 85, while the breaker gap of first controlled switch 25 is not to be connected in parallel. A bi-directional communication may then be realized as follows, for example:

During transmission from second control device 65 to first control device 60, first controlled switch 25 and second controlled switch 30 are to be open. When fourth controlled switch 85 is opened, an undefined potential is available at first connecting contact 75. If fourth controlled switch 85 is closed, a potential of approximately ground 40 is available at first connecting contact 75. If the undefined potential differs from ground 40, a binary signal may be generated in this way and transmitted via coil 20 from second control device 65 to first control device 60.

Conversely, when transmitting from first control device 60 to second control device 65, controlled switch 85 should be closed, whereas second controlled switch 30 should be open. If first controlled switch 25 is then closed, approximately operating-voltage potential 35 will be available at second connecting contact 76. On the other hand, if first controlled switch 25 is open, approximately ground 40 will be available at second connecting contact 76, so that a binary signal, which even has defined values, may be generated and transmitted from first control device 60 to second control device 65 via coil 20.

Figure 4:
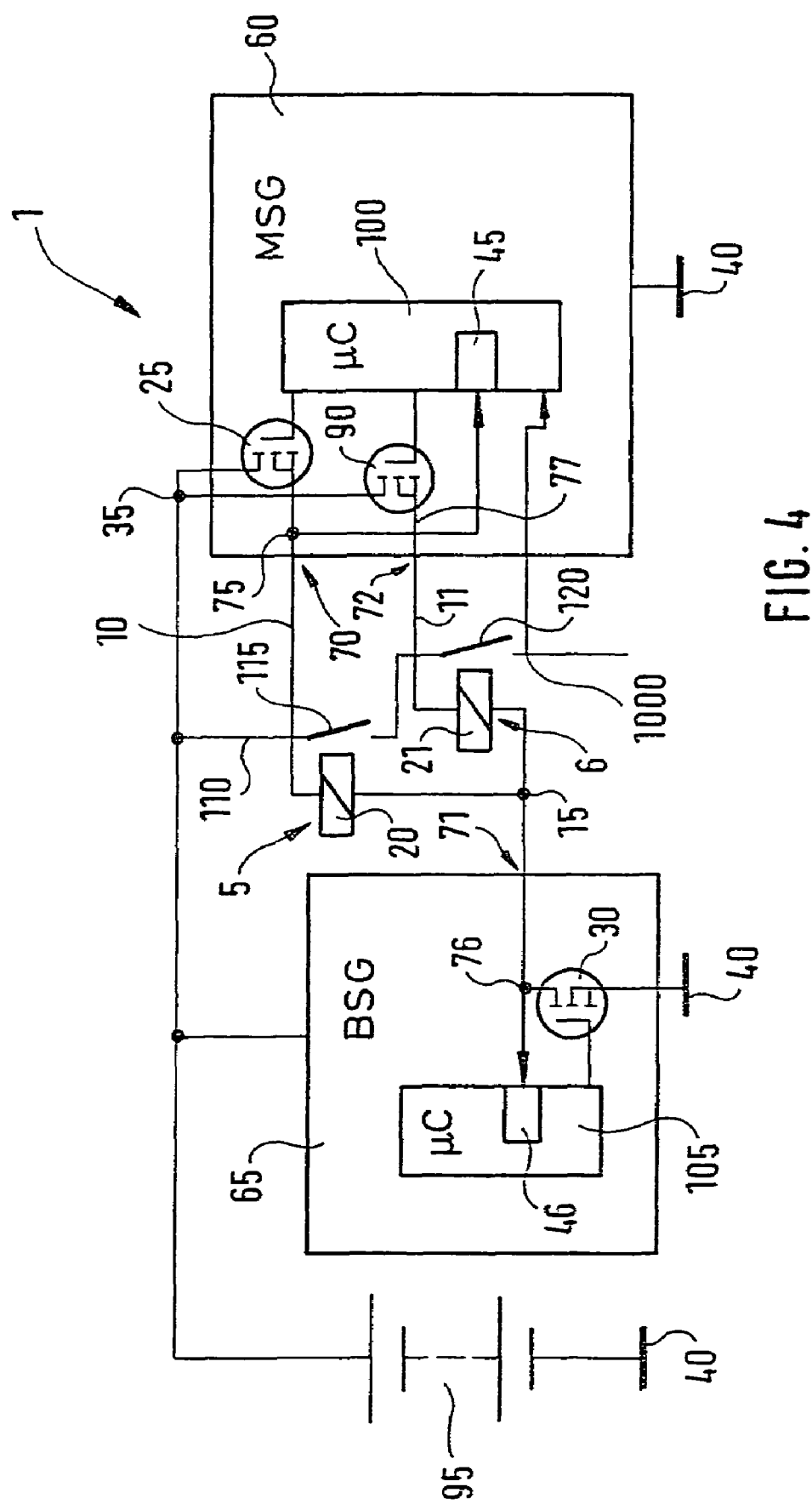
FIG. 4 shows a fourth exemplary embodiment of a device according to the present invention for triggering two electromagnetic actuators.

In a fourth exemplary embodiment according to FIG. 4, identical reference numerals again refer to the same elements as in the previous exemplary embodiments. On the basis of the first exemplary embodiment according to FIG. 1, first detection circuit 45 is integrated in first control 100 and second detection circuit 46 is integrated in second control 105. Otherwise the circuit according to the fourth exemplary embodiment according to FIG. 4 has the same configuration as the circuit according to the first exemplary embodiment according to FIG. 1. In addition, first control 60 includes a fifth controlled switch 90, which is triggered by first control 100 and embodied as field-effect transistor, for example. However, fifth controlled switch 90 may also have any other design known to one skilled in the art and be designed as bipolar transistor, for instance.

In addition, a second relay connection having a second coil 21 is provided, which includes a third coil connection 11 and a fourth connection, which is connected to first relay 5 and its second coil connection 15. Third coil connection 11 is connected to a third connecting contact 77, which is in the form of a single connecting contact of a third control connection 72 of first control device 60. Third connecting contact 77 is able to be connected to operating-voltage potential 35 via fifth controlled switch 90. In all other respect, the circuit according to FIG. 4 is configured as shown in FIG. 1. In this manner, both coils 20, 21, independently of one another, are able to be connected to operating-voltage potential 35 via first controlled switch 25 and fifth controlled switch 90, respectively, of first control device 60.

On the other hand, their connection to ground 40 is implemented via second controlled switch 30 of second control device 65. Both relays 5, 6 are thus able to be activated independently of one another via first control 100 of first control device 60. If the two relays 5, 6, as shown in FIG. 4, then switch the same load-current circuit, denoted by reference numeral 110 in FIG. 4, load-current circuit 110 likewise being connected in a manner not shown to operating-voltage potential 35 on one side and to ground 40 at the other side, three different and mutually separate conditions may be realized for the closing of load-current circuit 110 by a first controlled switch 25, a second controlled switch 30 and a fifth controlled switch 90.

Of course, as an alternative, the ground-side connection point of second coil 21 may also be connectable to ground 40, independently of second coil connection 15 of first coil 20, via an additional controlled switch of second control device 65, so that even four conditions for the closing of load-current circuit 110 are able to be realized in this manner by the two relays 5, 6.

Furthermore, as an alternative, the two connecting points, on the operating-voltage side, of coils 20, 21 may naturally also be connected to operating-voltage potential 35 via a common controlled switch of first control device 60.

In addition and in a corresponding manner, more than two relays may also be triggered by first control device 60 and second control device 65. The different relays triggered by first control device 60 and second control device 65 may activate switches in the same load-current circuit as shown in FIG. 4 or in different load-current circuits. According to FIG. 4, first relay 5 activates a first switch 115 and second relay 6 a second switch 120.

This series connection of first switch 115 and second switch 120 of load-current circuit 110 is advantageous when a relay-contact pair is fused and a separation is thus ensured by the second contact pair. If potential 1000 is advantageously detected at one of the contacts of second switch 120 by one of control devices 60, 65, such as by first control device 60 in FIG. 4, a diagnosis of load-current circuit 110 may be performed by individual switching of relays 5, 6.

Due to the possibility of detecting the switching state of the controlled switch of the one control device in the detection circuit of the other control device, which was already described in the first exemplary embodiment, it may be ascertained in the other control device whether or not a closing of the own controlled switch activates the relay.

In the relay-operating mode of device 1, as described, in one control device, the switching state of the controlled switch of the other control device may be detected or determined. If the communication is implemented by changing the switching state of first controlled switch 25 or second controlled switch 30, the detection of this switching state is carried out or performed in the same way manner as in the communication-operating mode according to the described exemplary embodiments. In the relay-operating mode, the switching state of the controlled switch of the other control device is ascertained per se, so as to check whether the relay may be activated by closing the own controlled switch.

In communication mode, on the other hand, it is not the switching state per se that is important, but the bit sequence defined by the alternating switching states. For instance, in the exemplary embodiments according to FIG. 2 and FIG. 3, a relay-operating mode of device 1 may be realized in which at least one of the high-ohmic resistors 50, 55 is connected in parallel to the one controlled switch triggering coil 20, so that the switching state of the other controlled switch triggering coil 20 is detectable at the coil terminal assigned to this coil 20.

Load 20 is embodied as coil in the described examples and thus represents an inductive load. Of course, load 20 may also have a purely ohmic design. In general, load 20 may be ohmic and/or inductive.

What is claimed is:

1. A device to control at least one electrical load, the load being a coil of an electromagnetic actuator, having a first load connection and a second load connection, comprising:
    a first controlled switch, wherein the first load connection, via the first controlled switch, is connectable to an operating-voltage potential; and
    a second controlled switch, wherein the second load connection is connectable to a reference-voltage potential via the second controlled switch;
    wherein a detection circuit is connected to at least one of the load connections, the detection circuit detecting at least one potential at a terminal of the at least one of the load connections; and
    wherein the device includes an operating mode in which signaling in the form of at least one switching state of one of the controlled switches occurs to the load terminal of the other controlled switch via the load, and a detection of the voltage resulting therefrom by the detection circuit occurs at the load terminal of the other controlled switch.

2. The device of claim 1, wherein a high-ohmic resistor is connected in parallel to at least one of the two controlled switches.

3. The device of claim 2, wherein a high-ohmic resistor is connected in parallel to each of the controlled switches.

4. The device of claim 1, wherein a high-ohmic resistor is connectable in parallel to at least one of the two controlled switches.

5. The device of claim 4, wherein the parallel connection of the individual high-ohmic resistor is implemented by an associated additional controlled switch.

6. The device of claim 2, wherein in an actuator operating mode, which is a load operating mode, of the device, at least one of the high-ohmic resistors is connected in parallel to one of the controlled switches, so that the switching state of the other controlled switch is detectable at the coil terminal assigned to this load.

7. The device of claim 1, wherein, in a communication operating mode of the device, a communication between the two load connections takes place via the load, by energizing or de-energizing the high-ohmic resistor at the one load connection and detecting the voltage resulting therefrom at the respective other load connection.

8. A control device comprising:
    at least one controlled switch;
    at least one control connection to control at least one electrical load, the load being a coil of an electromagnetic actuator, by the at least one controlled switch;
    wherein the control connection to control the load includes a single connecting contact to connect to precisely one of the connections of the load, and this connecting contact is connectable via the at least one controlled switch to precisely one of an operating-voltage potential or a reference-voltage potential; and
    wherein a communication occurs in a first operating mode by transmitting a signal to an additional control device via the load by switching the at least one controlled switch.

9. The control device of claim 8, further comprising:
    a detection circuit connected to the connecting contact to detect the potential at this connecting contact.

10. The control device of claim 8, wherein, in a second operating mode of the control device, a detection of voltage levels of signals from an additional control device transmitted via the load occurs at the connecting contact.

11. The control device of claim 10, wherein, in a third operating mode of the control device, a detection of the switching state of a controlled switch, connected to another connection of the load, of a further control device occurs at the connecting contact.

12. The control device of claim 8, wherein a high-ohmic resistor is connected in parallel to the controlled switches.

13. The control device of claim 11, wherein a high-ohmic resistor is connectable in parallel to the controlled switch.

14. The control device of claim 13, wherein the parallel connection of the high-ohmic resistor is implemented by an associated additional, controlled switch.

15. The control device of claim 13, wherein, in a fourth operating mode, a communication by transmission of a signal to an additional control device occurs via the load by energizing or de-energizing the high-ohmic resistor.

16. The device of claim 1, wherein the first and second connections are provided using different control devices.

* * * * *